United States Patent
Morin et al.

(10) Patent No.: US 10,068,908 B2
(45) Date of Patent: Sep. 4, 2018

(54) METHOD TO FORM LOCALIZED RELAXED SUBSTRATE BY USING CONDENSATION

(71) Applicant: STMicroelectronics, Inc., Coppell, TX (US)

(72) Inventors: Pierre Morin, Grenoble (FR); Nicolas Loubet, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/489,360

(22) Filed: Apr. 17, 2017

(65) Prior Publication Data
US 2017/0221903 A1 Aug. 3, 2017

Related U.S. Application Data

(60) Continuation of application No. 15/084,312, filed on Mar. 29, 2016, now Pat. No. 9,660,081, which is a
(Continued)

(51) Int. Cl.
*H01L 29/66* (2006.01)
*H01L 27/10* (2006.01)
(Continued)

(52) U.S. Cl.
CPC .. *H01L 27/10879* (2013.01); *H01L 29/41791* (2013.01); *H01L 29/4236* (2013.01);
(Continued)

(58) Field of Classification Search
CPC ... H01L 29/41; H01L 29/417; H01L 29/4179; H01L 29/41791; H01L 29/42;
(Continued)

(56) References Cited

U.S. PATENT DOCUMENTS 7,078,299 B2 7/2006 Maszara et al.
7,198,995 B2 4/2007 Chidambarrao et al.
(Continued)

FOREIGN PATENT DOCUMENTS

CN 1770470 A 5/2006

OTHER PUBLICATIONS

Tezuka et al., "Dislocation-free formation of relaxed SiGe-on-insulator layers," *Applied Physics Letters* 80(19):3560-3562, 2002. (4 pages).

*Primary Examiner* — Monica D Harrison
(74) *Attorney, Agent, or Firm* — Seed Intellectual Property Law Group LLP (57) ABSTRACT

Methods and structures for forming a localized, strained region of a substrate are described. Trenches may be formed at boundaries of a localized region of a substrate. An upper portion of sidewalls at the localized region may be covered with a covering layer, and a lower portion of the sidewalls at the localized region may not be covered. A converting material may be formed in contact with the lower portion of the localized region, and the substrate heated. The heating may introduce a chemical species from the converting material into the lower portion, which creates stress in the localized region. The methods may be used to form strained-channel finFETs.

21 Claims, 8 Drawing Sheets

Related U.S. Application Data division of application No. 14/194,215, filed on Feb. 28, 2014, now Pat. No. 9,660,080.

(51) Int. Cl.
| | |
|---|---|
| *H01L 27/108* | (2006.01) |
| *H01L 29/78* | (2006.01) |
| *H01L 29/417* | (2006.01) |
| *H01L 29/423* | (2006.01) |

(52) U.S. Cl.
CPC .... *H01L 29/66795* (2013.01); *H01L 29/7825* (2013.01); *H01L 29/7855* (2013.01)

(58) Field of Classification Search
CPC ... H01L 29/423; H01L 29/4236; H01L 29/66; H01L 29/667; H01L 29/6679; H01L 29/66795; H01L 29/78; H01L 29/782; H01L 29/7825; H01L 29/785; H01L 29/7855; H01L 27/10; H01L 27/108; H01L 27/1087; H01L 27/10879
USPC .......................................... 438/157; 257/302
See application file for complete search history.

(56) References Cited

U.S. PATENT DOCUMENTS

| | | | |
|---|---|---|---|
| 7,851,313 | B1 | 12/2010 | Luo et al. |
| 8,017,463 | B2 | 9/2011 | Chang |
| 8,513,073 | B1 | 8/2013 | Basker et al. |
| 8,716,156 | B1 | 5/2014 | Pawlak et al. |
| 8,921,940 | B2 | 12/2014 | Kim et al. |
| 9,034,723 | B1 | 5/2015 | Shieh et al. |
| 9,236,474 | B2 | 1/2016 | Morin |
| 9,660,081 | B2 | 5/2017 | Morin et al. |
| 2006/0076625 | A1 | 4/2006 | Lee et al. |
| 2006/0214225 | A1 | 9/2006 | Holt et al. |
| 2009/0321833 | A1 | 12/2009 | Basker et al. |
| 2011/0147811 | A1 | 6/2011 | Kavalieros et al. |
| 2011/0227165 | A1 | 9/2011 | Basker et al. |
| 2011/0291188 | A1 | 12/2011 | Cheng et al. |
| 2011/0291189 | A1 | 12/2011 | Cheng et al. |
| 2011/0309446 | A1 | 12/2011 | Doris et al. |
| 2012/0070953 | A1 | 3/2012 | Yu et al. |
| 2014/0134822 | A1 | 5/2014 | Srinivasan et al. |
| 2014/0183633 | A1* | 7/2014 | Chen ................. H01L 29/7855 257/347 |
| 2014/0252469 | A1 | 9/2014 | Lee et al. |
| 2014/0252483 | A1 | 9/2014 | Nagumo |
| 2014/0273378 | A1 | 9/2014 | Rodder |
| 2014/0299936 | A1 | 10/2014 | Zhang |
| 2014/0353760 | A1 | 12/2014 | Loubet et al. |
| 2015/0028349 | A1 | 1/2015 | Loubet et al. |
| 2015/0076514 | A1 | 3/2015 | Morin et al. |
| 2015/0187941 | A1 | 7/2015 | Zhou |
| 2015/0255457 | A1 | 9/2015 | Loubet et al. |

* cited by examiner

METHOD TO FORM LOCALIZED RELAXED SUBSTRATE BY USING CONDENSATION

BACKGROUND

Technical Field

The present disclosure relates to methods of fabricating strained-channel FETs and, in particular, a strained channel silicon-on-insulator transistor.

Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and super junction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (which lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for making localized strained regions of a substrate. The technology may be used to form strained-channel, field-effect transistors. According to some embodiments, a channel region of a finFET device may be strained by converting a first portion of the device's fin to a different chemical composition that will induce strain in a second portion of the fin where the channel region is formed. The conversion of the first portion may occur after the fin has been formed in a semiconductor material, and the first portion may be formed as a localized, relaxed region of the fin. For example, a fin may be formed in a semiconductor material (e.g., Si) by etching trenches to define the fin. Subsequently, a lower portion of the fin may be converted to a material having a different chemical composition (e.g., SiGe). After conversion, the lower portion may impart strain to the upper portion of the fin, yielding a strained-channel region for the finFET.

According to some embodiments, a method for straining a channel region of an FET comprises forming trenches in a first semiconductor material of a substrate to define a first region of the FET that contains a channel region of the FET. The method further includes converting, after formation of the trenches, a first portion of the first region to a different chemical composition such that the converted first portion imparts strain to the channel region. The converting may comprise heating the substrate to a temperature at which a chemical component from a conversion material condenses into the first portion, so as to form stress in the first portion. The heating during conversion of the material may allow plastic relaxation of the converted first portion.

In some aspects, the FET is a FD-SOI FET. In some aspects, the FET is a finFET. In some implementations, the first region comprises a fin of a finFET and has a width between about 1 nm and about 25 nm. According to some aspects, forming trenches may comprise etching trenches in the first semiconductor substrate to define at least one fin for at least one finFET.

In some implementations, a method for straining a channel region of an FET may comprise covering a second portion of the first region, depositing a converting material in the trenches, and heating the substrate to a temperature at which at least some component of the converting material enters the first portion of the first region. The converting material may comprise a second semiconductor material that is of a different chemical composition than the first semiconductor material. In some aspects, the converting material is SiGe or SiC and the first semiconductor material is Si. In some implementations, the heating comprises oxidizing the converting material. In some aspects, the depositing comprises epitaxially growing the converting material. In some implementations, the depositing comprises depositing an amorphous composition of the converting material.

A method for straining a channel region of an FET may further include depositing a filling material to fill the trenches before heating the substrate. In some implementations, the filling material is an oxide. In some implementations, a method may comprise transforming a portion of the converting material to an oxide. According to some aspects, a method for straining a channel region of an FET may comprise removing a portion of the filling material to expose the channel region, and forming a gate structure at the channel region.

The foregoing aspects and implementations of acts may be included in any suitable combination in a method for straining a channel region of an FET.

According to some embodiments, a strained-channel finFET comprises a fin having a channel region formed of a first semiconductor material. The first semiconductor material may have a first chemical composition. The finFET may further include a strain-inducing portion formed in the fin that induces strain in the channel region of the fin, wherein the strain-inducing portion comprises the first semiconductor material that has been converted to a second semiconductor material that has a second chemical composition that is different from the first chemical composition.

In some implementations, the second semiconductor material includes a chemical additive compared to the first semiconductor material, and a concentration of the chemical additive varies across the fin. In some aspects, the concentration of the chemical additive is higher at edge regions of the fin than at a center of the fin. In some implementations, the chemical additive is germanium or carbon and the first semiconductor is silicon.

According to some aspects, the fin may have a width between about 1 nm and about 25 nm. In some implementations, a strained-channel finFET may comprise a layer of covering material that covers the channel region of the fin but does not cover the strain-inducing portion of the fin. In some aspects, the covering material comprises an oxide or a nitride.

In some implementations, a strained-channel finFET may comprise a gate structure formed at the channel region of the fin. In some aspects, a strained-channel finFET may comprise a continuous layer of insulating material between the fin and a bulk region of a substrate on which the fin is formed. In some implementations, the strain-inducing portion of a strained-channel finFET has a defect density greater than $10^5$ defects/cm$^2$.

The foregoing aspects and implementations may be included in any suitable combination in one or more embodiments of a strained-channel finFET.

According to some embodiments, a finFET structure on a substrate may comprise a fin formed in a first semiconductor material of a first chemical composition. The fin may have a length extending parallel to a surface of the substrate and a height extending perpendicular to the surface of the substrate. The structure may further include a covering layer that covers a first portion of the fin and does not cover a second portion of the fin, wherein a boundary between the first portion and second portion extends along a length of the fin. The finFET structure may also include a converting material in direct contact with the second portion of the fin. The converting material may contain a chemical component that, when introduced into the second portion of the fin, creates compressive or tensile stress along a length of the region into which it is introduced.

In some aspects, the fin has a width between about 1 nm and about 25 nm. In some aspects, the first semiconductor material is silicon. In some implementations, the chemical component is germanium or carbon. According to some aspects, the converting material comprises epitaxial SiGe or SiC. According to other aspects, the converting material comprises amorphous SiGe or SiC. In some implementations, the covering layer comprises an oxide or a nitride.

The foregoing implementations and aspects relating to a finFET structure may be included in any suitable combination for one or more embodiments of a finFET structure. Any of the above-described method embodiments may be used to fabricate any embodiment of a finFET structure or a strained-channel finFET.

The foregoing and other aspects, implementations, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1:
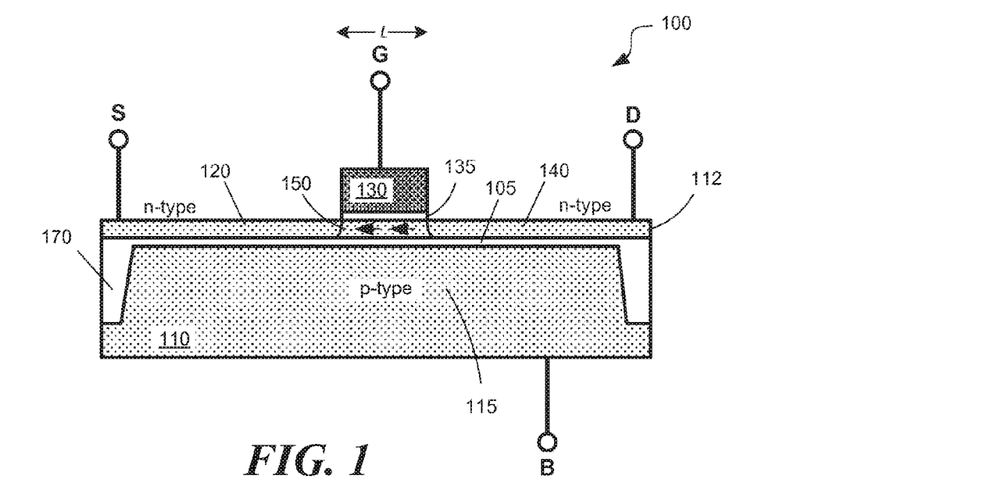
FIG. 1 is an elevation view depicting a FD-SOI FET, according to some embodiments.

An example of a fully depleted silicon-on-insulator (FD-SOI) FET 100 is depicted in FIG. 1, according to some embodiments. The FD-SOI FET may comprise a source region 120, a gate structure 130, 135, a drain region 140, and a channel region 150. The source, channel region, and drain may be formed in a thin semiconductor layer 112 that is formed adjacent a thin insulating layer 105 or buried oxide layer 105. The thin insulating layer may be formed adjacent a substrate 110. In some implementations, the semiconductor layer 112 and insulating layer 105 are ultrathin, e.g., less than about 20 nm. Such devices may be referred to as ultra-thin body and buried oxide (UTBB) devices. In a UTBB structure, the thin insulating layer 105 may be less than about 30 nm in thickness, with a preferred thickness of about 25 nm for some embodiments, and the semiconductor layer 112 may be less than about 10 nm, with a preferred thickness of about 7 nm for some embodiments, for example. In some embodiments, trench isolation structures 170 comprising electrically-insulating material may be formed around one or more FD-SOI FETs. The gate structure may comprise a gate conductor 130 and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of a FD-SOI FET may be doped with acceptor or donor impurities to form regions of a first conductivity type, e.g., p-type or n-type. The channel region 150 may be doped to be of an opposite conductivity type, and may be of a same conductivity type as a back body region 115, e.g., partially depleted SOI or PD-SOI. In some implementations, the channel region 150 may be undoped (FD-SOI). A FD-SOI FET can exhibit reduced leakage currents compared to bulk FET devices and offer flexible bias strategies for improving speed or reducing threshold voltages for low-voltage applications.

Figure 2A:
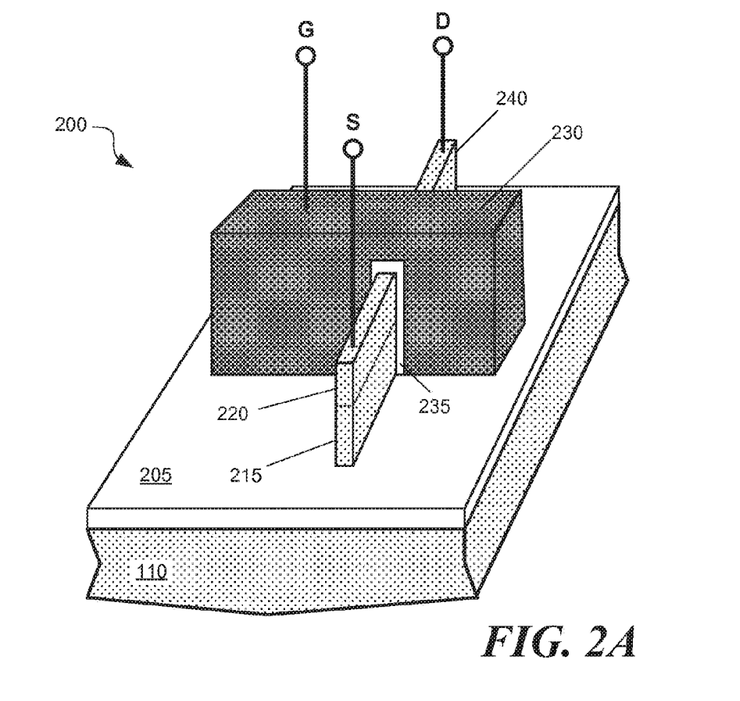
FIG. 2A is a perspective view depicting a finFET, according to some embodiments.

An example of a finFET 200 is depicted in the perspective view of FIG. 2A, according to some embodiments. A finFET may be fabricated on a bulk semiconductor substrate 110, e.g., a silicon substrate, and comprise a fin-like structure 215 that runs in a length direction along a surface of the substrate and extends in a height direction normal to the substrate surface. The fin 215 may have a narrow width, e.g., less than 50 nanometers. There may be an electrically-insulating layer 205, e.g., an oxide layer, on a surface of the substrate 110. The fin may pass through the insulating layer 205, but be attached to the semiconducting substrate 110 at a lower region of the fin. A gate structure comprising a conductive gate material 230, e.g., polysilicon, and a gate insulator 235, e.g., an oxide or a high dielectric constant material, may be formed over a region of the fin. The finFET may further include a source region 220 and drain region 240 adjacent to the gate. A finFET may also include integrated source S, gate G, drain D, and body B interconnects (not shown) to provide electrical connections to the source, gate, drain, and back body regions of the device.

FinFETs like those depicted in FIG. 2A exhibit favorable electrostatic properties for scaling to high-density, low-power, integrated circuits. Because the fin and channel are raised from the substrate, the devices can exhibit reduced cross-coupling between proximal devices. For the device shown in FIG. 2A, the fin 215 may be formed from the bulk substrate 110 by an etching process, and is therefore attached to the substrate at a base region of the fin, a region occluded in the drawing by the adjacent insulator 205. The insulator 205 may be formed after the etching of the fin 215. Because the fin 215 is attached to the semiconductor substrate, leakage current and cross-coupling may occur via the base region of the fin.

Figure 2B:
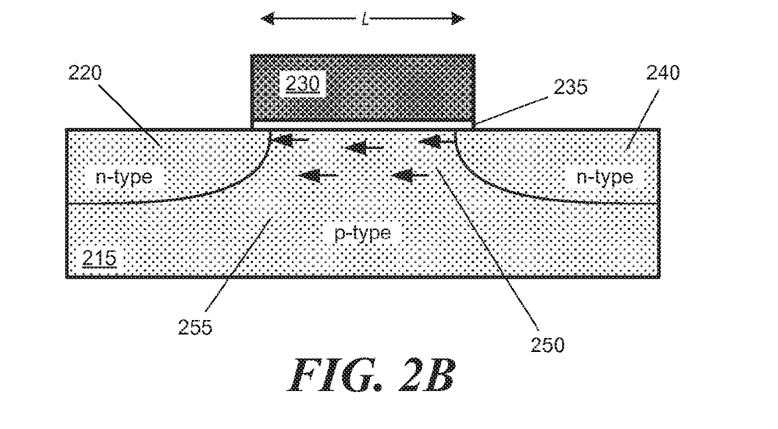
FIGS. 2B-2E depict cross-sectional views of finFET fins, according to various embodiments.
Figure 2C:
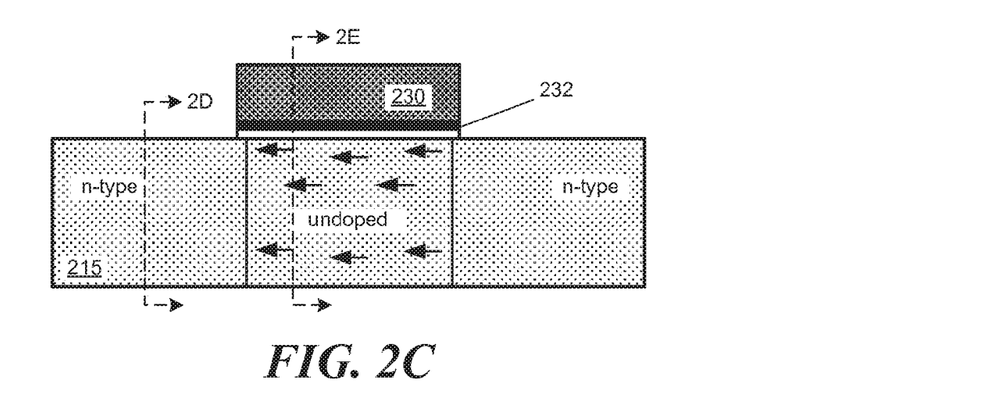

Source, channel, and drain regions of a finFET may be doped with donor or acceptor impurities to create different regions of different conductivity types, as depicted in FIGS. 2B-2C. Several different configurations of source, channel, and drain regions are possible. According to some embodiments, source region 220 and drain region 240 may be doped to be of a first conductivity type and the channel region 250 may be doped to be of an opposite conductivity type, as depicted in FIG. 2B. The terms "source region" and "drain region" as used may include extension regions of the fins that lie between source and drain contact regions and the channel region of the finFET device.

Figure 2D:
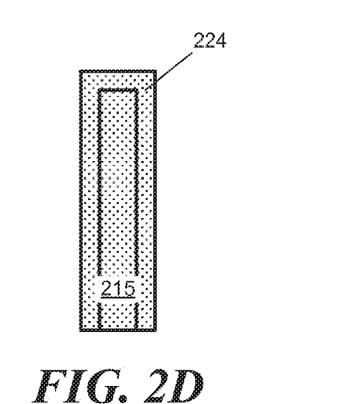

The finFET may further include a body region 255 that may be of a same conductivity type as the channel region. In some embodiments, a channel region 250 of a finFET may be undoped, as depicted in FIG. 2C. The doping of source and drain regions in a finFET may be of various geometries. As depicted in FIG. 2B, vertical portions of the fin 215 may be doped to form source 220 and drain 240 regions. Alternatively, according to some embodiments, outer sheath portions 224 of a fin 215 may be doped to form source and drain regions, as depicted in FIGS. 2C-2E.

Figure 2E:
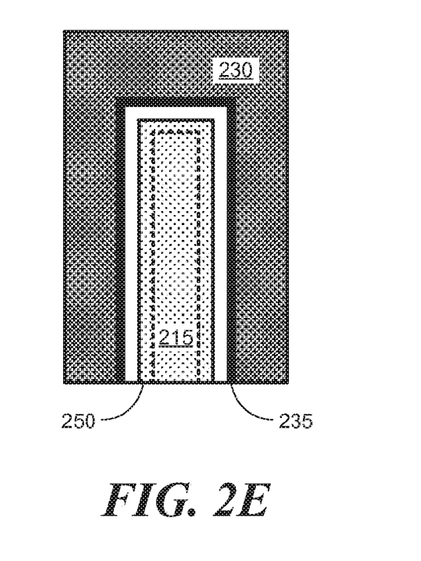

FIG. 2C and FIG. 2E depict a three-dimensional nature of a channel region 250 in a finFET, according to some embodiments. In some embodiments, the entire fin portion encased by the gate structure may be inverted and form a bulk channel rather than a surface channel. A metallic film 232 may be deposited between a gate electrode 230 and gate oxide 235 in some implementations to improve gate conductance and gate switching speeds.

The inventors have conceived of methods and structures for locally straining regions on semiconductor substrates, and that may be used to further improve the performance of finFET and FD-SOI FET devices. In various embodiments, trenches may be formed at boundaries of a localized region of a substrate, e.g., a region of a semiconductor substrate in which at least one finFET or FD-SOI FET may be formed. At least some of a lower portion of the localized region may be converted to a strain-inducing material that has a chemical composition different than that of the semiconductor substrate. The strain-inducing material may impart strain to an adjacent portion, e.g., an upper portion, of the localized region, in which at least a portion of a FET, e.g., a finFET or FD-SOI device, may be formed. For example, a channel region of the FET may be formed in the strained portion of the localized region.

The induced strain in a channel region may improve the mobility of carriers in the channel regions, and thereby improve device speed. For example compressive straining of silicon (Si) can improve the hole mobility within silicon. Tensile straining of Si can improve electron mobility. When enough strain is applied, the performance of silicon-based transistor devices can approach or even surpass the performance of devices based on compound semiconductors, e.g., SiGe, SiC, GaAs, InP, InGaAs, GaN, AlGaAs, etc., which may require more difficult and expensive processing techniques.

FIGS. 3A-3K depict process steps for forming localized strained regions of a semiconductor substrate for some embodiments. The illustrated steps depict how the straining techniques can be applied to finFET devices. It will be appreciated that the described steps may be applied to other devices that would benefit from a mechanically strained region of a substrate.

Figure 3A:
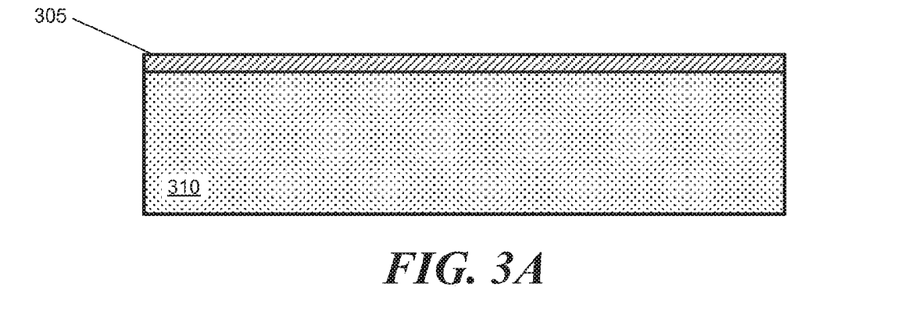
FIGS. 3A-3O depict process steps for forming strained-channel finFETs, according to some embodiments.

According to some embodiments, a substrate 310 may be obtained or formed that includes a hard mask layer 305 formed over at least a region of the substrate, as illustrated in FIG. 3A. The substrate may be a semiconductor substrate made of, for example, Si, SiGe, SiC, Ge, GaN, GaAs, AlGaAs, InGaP, in some embodiments, or may be another type of substrate, e.g., ceramic, optical glass, electro-optical material, in other embodiments. The substrate 310 may contain multiple layers of different materials or similar materials. For example, the substrate may comprise a silicon-on-insulator (SOI) substrate, or may comprise a bulk semiconductor with one or more epitaxial layers formed at a surface.

The hard mask layer 305 may be any suitable material that exhibits etch selectivity over the immediately-adjacent region of the substrate. Some examples of hard mask materials include, but are not limited to, oxides, nitrides, and metals. In some embodiments, the hard mask layer 305 comprises a silicon oxide or silicon nitride. In some implementations, a soft mask layer, e.g., a polymer-based resist, may be used instead of a hard mask layer 305.

Figure 3B:
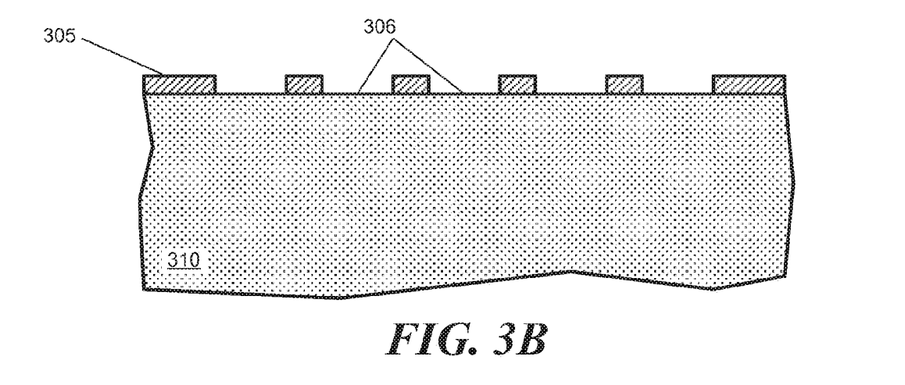

A method for forming a localized strain region of a substrate may comprise patterning the hard mask layer 305 to expose areas of the substrate 310, as depicted in FIG. 3B. The patterning may be done by any suitable lithographic technique. Some applicable lithographic techniques include various forms of photolithography, x-ray lithography, or various techniques of imprint lithography. For patterning high-resolution finFET devices, a sidewall image transfer (SIT) technique or mandrel process may be used. A sidewall image transfer process may be referred to as self-aligned double patterning (SADP) in some cases. In some implementations, fins may be formed using a double patterning process, e.g., resist-on-resist patterning techniques (which may include a lithography-etch-lithography-etch (LELE) process or a lithography-freeze-lithograph-etch (LFLE) process). In other embodiments, the fins may be formed by interferometric lithography, imprint lithography, photolithography, extreme ultraviolet lithography, or x-ray lithography.

Figure 3C:
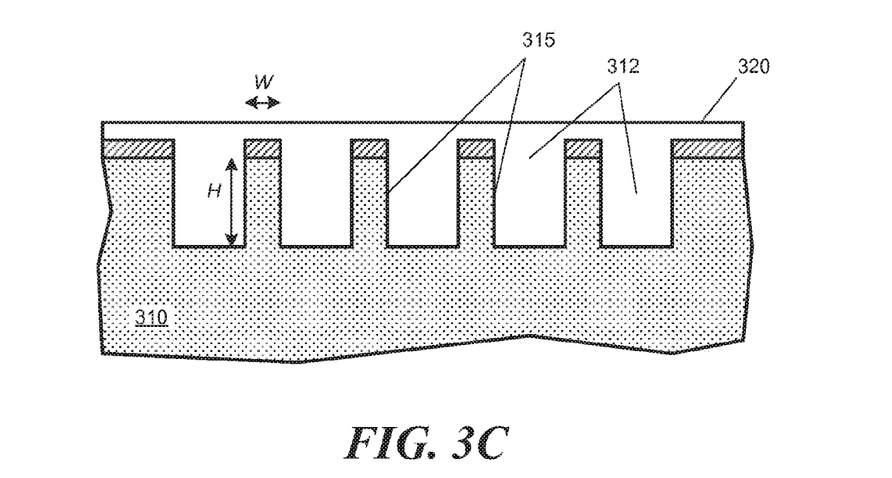

As depicted in FIG. 3C, trenches 312 may then be etched into the substrate using any suitable etching technique, e.g., anisotropic reactive-ion etching. The etched trenches may bound localized regions 315 of the substrate. In the illustrated embodiment, the localized regions may comprise fins that are used for forming finFETs. In this case, the fins 315 may have a width W and a height H as noted, and a length L that extends into the page. The width of a fin may be between about 1 nm and about 25 nm in some embodiments, though larger widths may be used in other embodiments. The width of a localized region in other applications may have similar values or may be greater, e.g., any value up to about 500 nm. The height of a fin may be between about 10 nm and about 100 nm. The height of a localized region in other applications may have similar values or may be greater, e.g., any value up to about 5 microns.

According to some embodiments, the trenches 312 may be filled with a filling material 320. The hard mask 305 may or may not be removed before the filling of the trenches. The filling material 320 may be any suitable material that can withstand high thermal process steps, e.g., temperatures up to about 800° C. in some embodiments, up to about 900° C. in some embodiments, up to about 1000° C. in some embodiments, and up to about 1200° C. in some embodiments. In some implementations, the filling material may comprise an oxide or a nitride. The filling material 305 may exhibit etch selectivity over the adjacent region of the semiconductor substrate 310. In some implementations, the trenches may be overfilled and the substrate planarized, e.g., via a chemical-mechanical polishing (CMP) process, to yield a substantially planar surface as depicted in FIG. 3C.

Figure 3D:
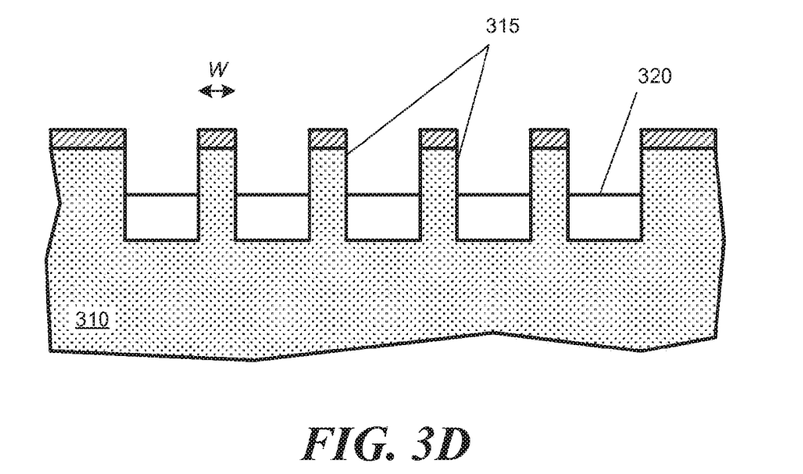

According to some embodiments, the filling material 320 may be etched back or recessed using any suitable etching process, e.g., anisotropic reactive ion etching, so as to expose a portion of the fin 315, as depicted in FIG. 3D. The etch may be a timed etch that is based on a known etch rate for the filling material. For example, approximately an upper half or more of the fin may be exposed. The etching process may selectively etch the filling material at a significantly higher etch rate than the substrate material, and may not etch the hard mask material 305.

Figure 3E:
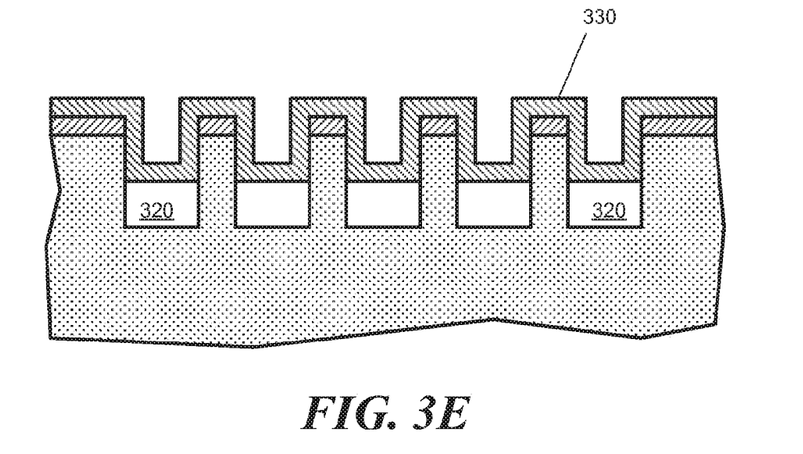

A covering layer 330 may then be formed over the exposed portions of the fins, as depicted in FIG. 3E. The covering layer may exhibit etch selectivity over the filling material 320 and the substrate 310. According to some embodiments, the covering layer 330 may comprise silicon nitride, the filling material may comprise silicon oxide, and the substrate may comprise silicon, though other materials may be used in other embodiments. The covering layer 330 may be deposited by any suitable means. According to some embodiments, the covering layer is deposited by a conformal deposition process, e.g., a plasma deposition process, chemical vapor deposition process, or atomic layer deposition process. The covering layer may be deposited to a substantially uniform thickness over the exposed surfaces of the substrate. The thickness of the covering layer 330 may be between 1 nm and 50 nm, in some embodiments.

Figure 3F:
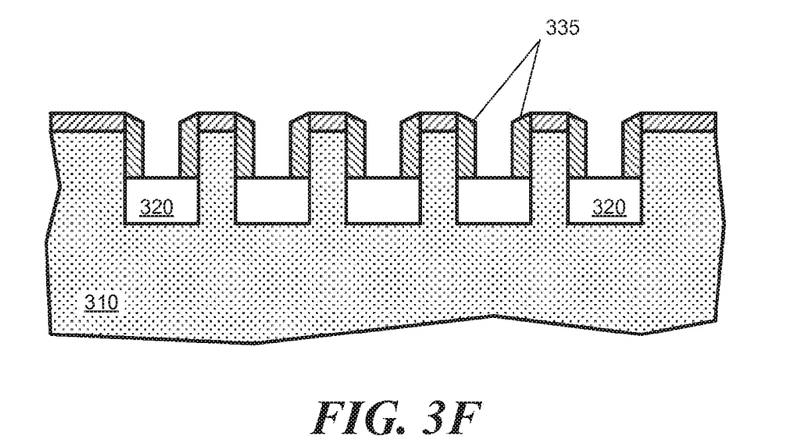
Figure 3G:
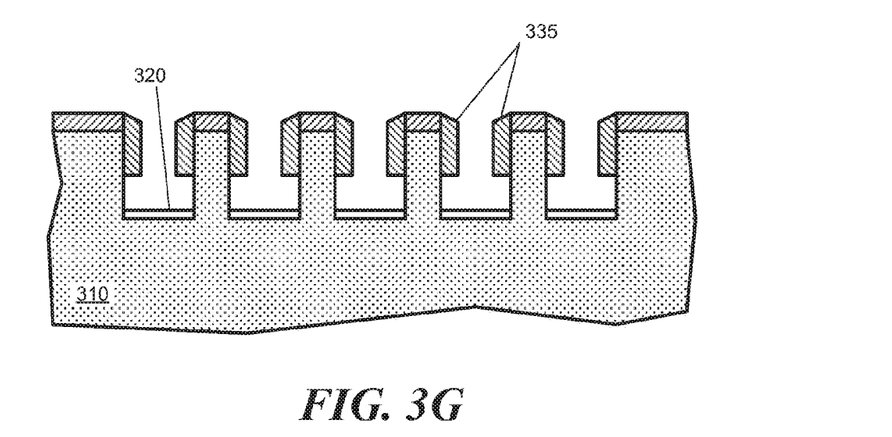

The covering layer 330 may subsequently be etched to remove horizontal portions, as depicted in FIG. 3F. For example, an anisotropic etch (ME) may be employed and timed to etch through the thickness of the covering layer 330. Sidewall portions 335 of the covering layer may remain after the etching step. In some implementations, any suitable spacer process that is conventionally used for forming FET gate spacers may be used to form the sidewall portions 335. The filling material 320 may subsequently be etched to remove most of the filling material, as illustrated in FIG. 3G. A thin layer of filling material may remain at the bottom of the trenches. The thin layer may prevent subsequent formation of conversion material 340 in contact with the substrate 310 at the base of the trenches 312. In some embodiments, all of the filling material 320 may be removed. As illustrated in FIG. 3G, a lower portion of the fins become exposed after etching back the filling material 320.

Figure 3H:
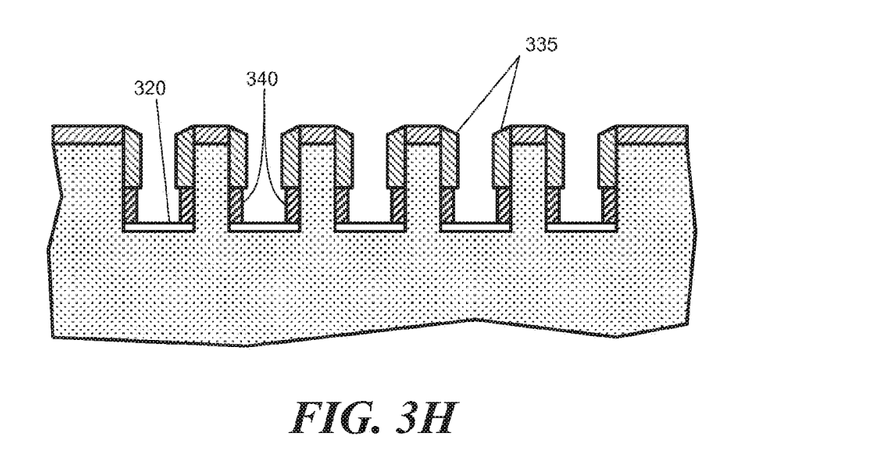

A conversion material 340 may then be formed in direct contact with exposed regions of the fins, as depicted in FIG. 3H. The conversion material may be of a chemical composition that is different than the chemical composition of the substrate 310. According to some embodiments, the conversion material 340 includes a chemical component that, when introduced into the adjacent region of the substrate, induces stress in the region into which it is introduced. In some implementations, the conversion material may comprise a doped variant of the substrate material. As a non-limiting example, the substrate 310 may be bulk Si and the conversion material 340 may be SiGe. Germanium from the SiGe, introduced into the bulk Si, can induce stress in a region of the Si into which it is introduced.

The conversion material 340 may be formed by any suitable means. For example, the conversion material may be formed by epitaxial growth in some embodiments to produce a substantially crystalline structure. In other embodiments, the conversion material 340 may be formed by a deposition process, e.g., a plasma deposition or atomic layer deposition process. Because the conversion material 340 will not be utilized as an active region of a device, the conversion material need not be of high crystalline quality. In some embodiments, the conversion material may be amorphous. In some embodiments, the conversion material may be a semiconductor material, while in other embodiments the conversion material may not be a semiconductor material.

If formed by epitaxy, the conversion material may have a high concentration of the chemical component that is introduced into the adjacent substrate regions. The concentration of the chemical component in the conversion material may be so high as to cause the formation of defects in the conversion material 340. According to some embodiments, the conversion material comprises germanium-doped silicon formed by epitaxial growth where the concentration of Ge in the formed structures is between 10% and 60%. The defect density in the conversion material may be higher than otherwise would normally be tolerated in a semiconductor device. For example, the defect density may be greater than $10^3$ defects/$cm^2$ in some embodiments, greater than $10^5$ defects/$cm^2$ in some embodiments greater than $10^7$ defects/$cm^2$ in some embodiments, and yet greater than $10^9$ defects/$cm^2$ in some embodiments. In some implementations, the defect density may be greater than $10^{10}$ defects/$cm^2$. In some implementations, the defect density in the conversion material may have a value less than $10^6$ defects/$cm^2$.

Figure 3I:
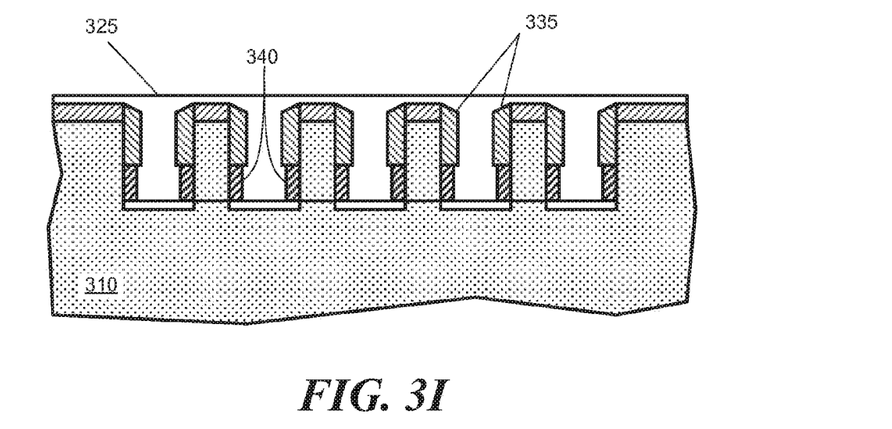

After formation of the conversion material, the trenches may be filled with a second filling material 325 and subsequently planarized, as depicted in FIG. 3I. The second filling material may be the same as, or different from, the filling material 320. The second filling material 325 may be any suitable material that can also withstand high thermal processing steps, e.g., temperatures up to about 800° C. in some embodiments, up to about 900° C. in some embodiments, up to about 1000° C. in some embodiments, and up to about 1200° C. in some embodiments. In some implementations, the second filling material may comprise an oxide or a nitride. The second filling material 325 may exhibit etch selectivity over the adjacent region of the semiconductor substrate 310 and over a region of the substrate into which a chemical component from the conversion material is introduced. The second filling material 325 may provide mechanical support to the fins during a subsequent heating step.

Figure 3J:
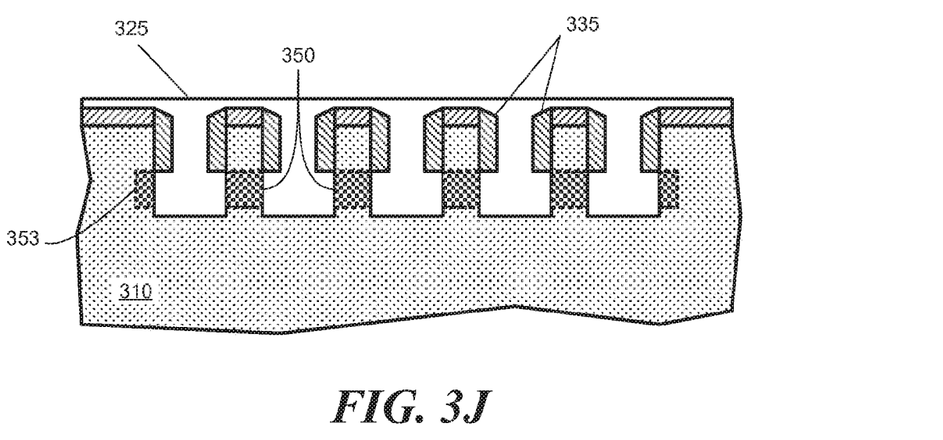

The substrate may be heated to a high temperature so as to condense a chemical component from the conversion material 340 into the adjacent, localized regions of the substrate 310, so as to produce converted regions 350 of a different chemical composition, as depicted in FIG. 3J. In some embodiments, the conversion process may be activated by oxidizing the conversion material 340. For example, the conversion material 340 may comprise SiGe that, under high temperatures, oxidizes to form $SiO_2$ and condenses or drives the Ge into the adjacent fin regions of the substrate. In some embodiments, the chemical component condensed into an adjacent region 350 may have a non-uniform concentration across that region. For example, a concentration of the condensed component Ge may be highest at the edges of the converted regions 350 and lowest at the centers of the regions.

A converted region 350 may have a different structure than an epitaxially-grown region of similar chemical composition, and its configuration within a substrate may be different than an epitaxially-grown layer. For example, a converted region may include a greater concentration of impurity atoms at interstitial sites (rather than substitutional sites) within the crystal lattice than would be the case for epitaxially-grown regions. Also, converted regions may not extend uniformly across the substrate as epitaxial layers would. For example, some converted regions 350 may terminate laterally into a semiconductor layer, like the outer converted regions 353 depicted in FIG. 3J. X-ray diffraction spectra may distinguish between converted regions and epitaxially-grown regions.

A converted region 350 (also referred to as a strain-inducing region or strain-inducing portion) of the substrate may form under stress as an impurity from the conversion material is condensed into the region. During the heating and conversion process, the strain-inducing region may relax, e.g., by elastic or plastic relaxation. The relaxation can impart strain to adjacent regions. For example, Si converted to a SiGe composition may have a different lattice parameter that is mismatched from the adjacent Si. The mismatch results in stress. Because the fins may have a finite length and raised structure (e.g., free ends) from the substrate 310, the converted portions 350 of the fins may relax to accommodate the stress. This relaxation imparts strain to the adjacent (upper) portion of the fin. In the above-described example that converts Si to SiGe at the base of the fin, the fin may relax such that the non-converted portion 360 of the fin is subject to tensile strain, predominantly along its length. Other embodiments may use other material combinations for other semiconductor materials to impart tensile or compressive strain to an adjacent region.

Figure 3K:
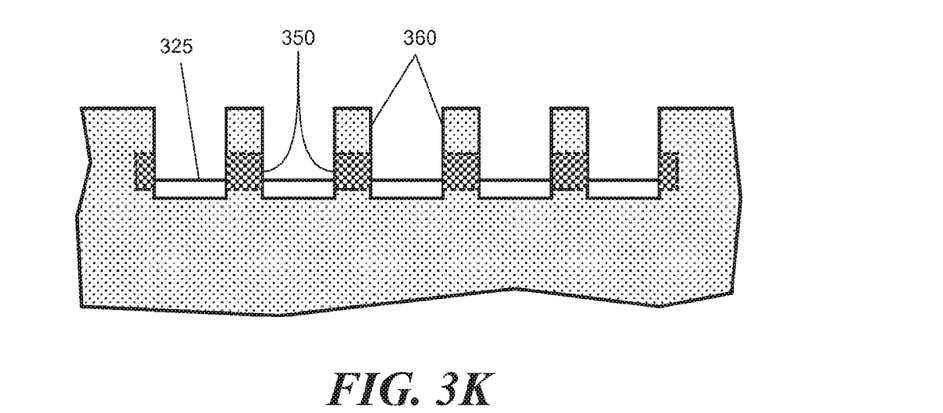

The second and first filling materials 325, 320 may be etched back as illustrated in FIG. 3K, so as to expose at least the non-converted (upper) portions of the fin. The sidewall portions 335 and remaining hard mask material 305 may also be removed. In some embodiments, the filling materials are etched back to expose some or all of the converted regions 350, so as to allow further relaxation of the converted regions. The removal of the sidewall portions 335 and filling materials may increase an amount of strain in the non-converted portion of the fin, by allowing additional relaxation of the converted regions.

Gate structures comprising a gate conductor 370 and gate insulator 372 may be formed over the fins to define channel regions, as illustrated in FIG. 3L-3O. The gate structures may be formed using any suitable process steps conventionally used to form gate structures on fins, in some embodiments. In some embodiments, an etch-back of insulator 325 depicted in FIG. 3K may only be performed at areas where the gate conductor and gate oxide will be formed. For example, a photoresist (not shown) may be patterned over the insulator 325 of FIG. 3J (which may or may not be planarized), so as to form openings in the photoresist at locations of the gate structures. The insulator 325 may then be etched to expose channel regions of the fins. The etched regions of the insulator 325 may appear as trenches that run transverse to the length direction of the fins. In some embodiments, the etch may stop at approximately the interface between the non-converted portions 360 of the fin and the converted regions 350. In some implementations, the etch may extend past the interface to expose at least some of the converted regions 350.

Figure 3L:
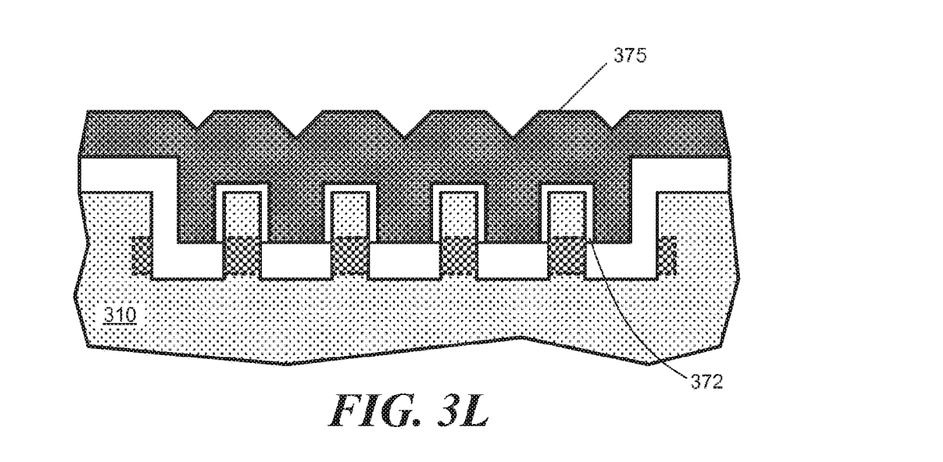
Figure 3M:
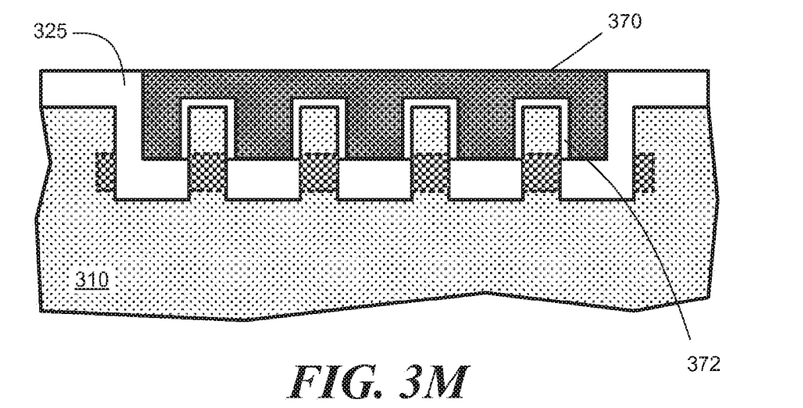

With the channel regions exposed, a gate oxide or gate dielectric 372 may be formed over the channels using any suitable process. In some embodiments, the gate oxide may comprise silicon oxide formed by deposition or thermal oxidation of the fin. In some implementations, a high dielectric constant (high-K) material may be used, e.g., hafnium silicate, hafnium dioxide, zirconium silicate, or zirconium dioxide. A gate conductor material 375, e.g., polysilicon, may then be deposited over the gate dielectric. The gate conductor material 375 may be deposited over an extended region, e.g., extending beyond the etched trenches in the insulator 325, as depicted in FIG. 3L. The gate conductor material may then be etched back or planarized to form a gate conductor 370, as depicted in FIG. 3M. A subsequent timed etch may be used to remove insulator 325 over source and drain regions of the fins, yielding a structure like that shown in FIG. 3O.

Figure 3N:
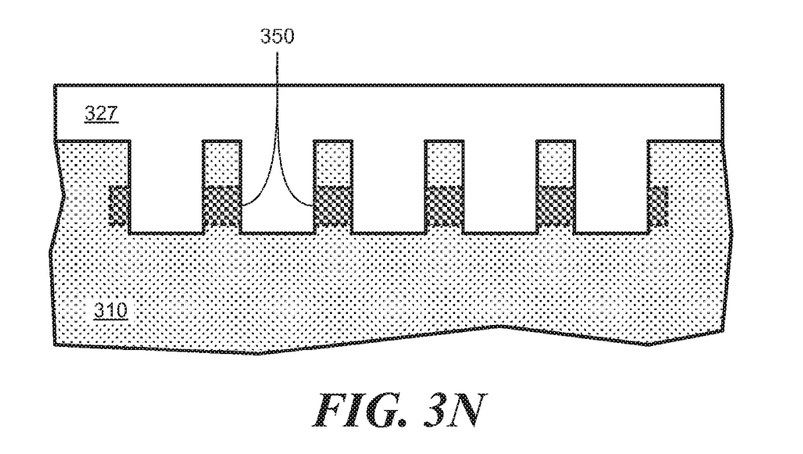

Alternative processing may be used to form gate conductors in some embodiments. For example and referring again to FIG. 3K, according to one embodiment the insulator 325 may be etched back to expose at least some of the converted portions 350 and allow further relaxation of those portions. A gate insulator 372 and gate conductor material 375 may then be deposited over the exposed fins. In another embodiment, the insulator 325 may be completely removed. Removal of the insulator 325 may allow a higher strain to form in the non-converted fin portions 360. Subsequently, an insulator 327 may be deposited to cover the fins as depicted in FIG. 3N. The insulator 327 may then be etched back to approximately the interface between the non-converted portions 360 and converted portions 350 of the fins. Etching to this level can help reduce unwanted capacitance between the gate electrode and converted regions 350. A gate dielectric 372 may then be formed over the exposed regions of the fins, and a gate conductor material 375 may be deposited over an extended region of the substrate.

Figure 3O:
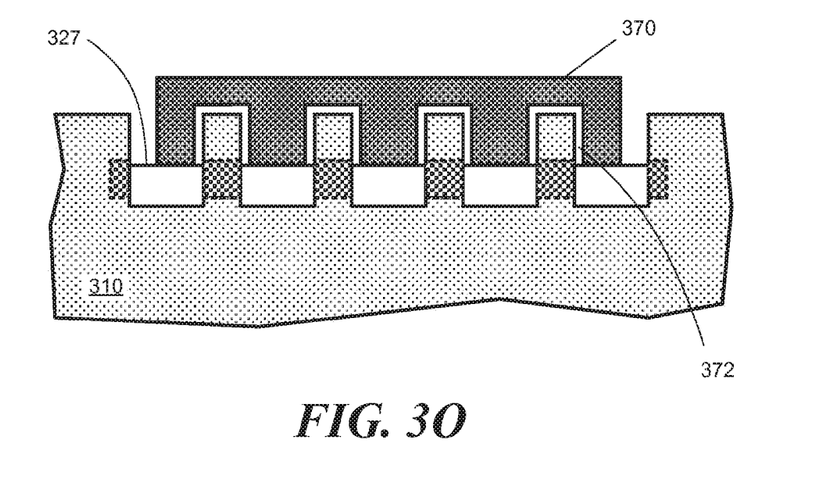

The gate conductor material 375 may be patterned to form gate conductors 370 over channel regions of the fins using any suitable lithographic process, e.g., photolithography and reactive ion etching. The gate conductors 370 may then be used as an etch mask to remove gate dielectric material from the source and drain regions of the fins. The resulting structure may appear as shown in FIG. 3O.

Exposed source and drain regions of the finFETs may be doped and contacts to the gate, source and drain regions may be formed by any suitable process. There may be one gate structure per fin, individually and separately controlling a single finFET in some embodiments. In some implementations, there may be an extended gate structure, as depicted in FIG. 3O, that controls a plurality of finFETs together.

Although the methods described above depict a bulk semiconductor substrate, the methods may be used for silicon-on-insulator (SOI) substrates. For example, the region in which fins are etched may be a silicon or semiconductor layer formed on an insulating layer.

Figure 4:
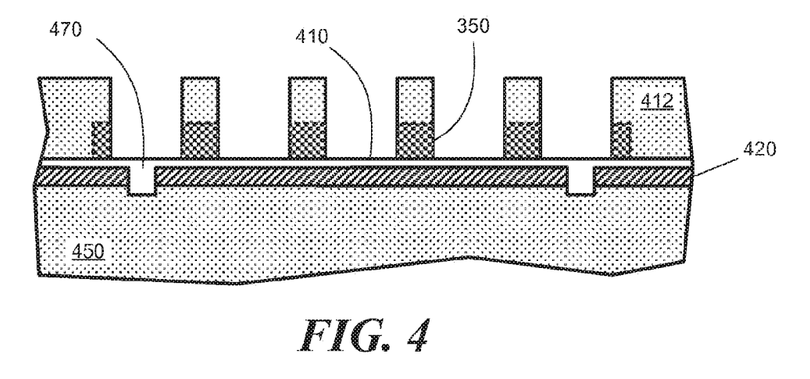
FIG. 4 depicts an embodiment combining two strain-inducing techniques for finFETs, according to some embodiments.

The method of inducing strain described in connection with FIGS. 3A-3K may be combined with other techniques of inducing strain in an active device. For example, the methods of inducing strain described herein may be combined with methods to form strain-inducing layers in SOI substrates as described in U.S. Pat. No. 9,236,474, titled, "Method to Form Strained Channel in Thin Box SOI Structures By Elastic Strain Relaxation of the Substrate," which is incorporated by reference in its entirety. FIG. 4 depicts an embodiment in which a strain-inducing layer 420 is formed in a SOI substrate structure having an insulating layer 410 and a semiconductor layer 412 formed on a substrate 450. In some embodiments, trenches (e.g., isolation trenches 470) may be formed adjacent one or more finFETs so as to relieve stress in a localized region of the strain-inducing layer 420 and impart strain to the semiconductor layer 412 in that region. As described in the co-pending application, the geometry of the trenches 470 may be selected to impart a desired type of strain, e.g., uniaxial, biaxial, etc. For example, the trenches 470 may be formed through the strain-inducing layer 420 only at opposing ends of the fins, so as to impart uniaxial strain along the length of the fins.

Figure 5A:
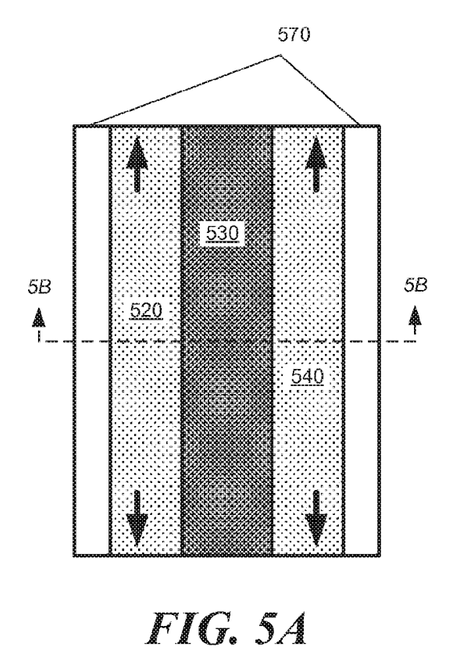
FIGS. 5A-5B depict a strained-channel FD-SOI FET, according to some embodiments.
Figure 5B:
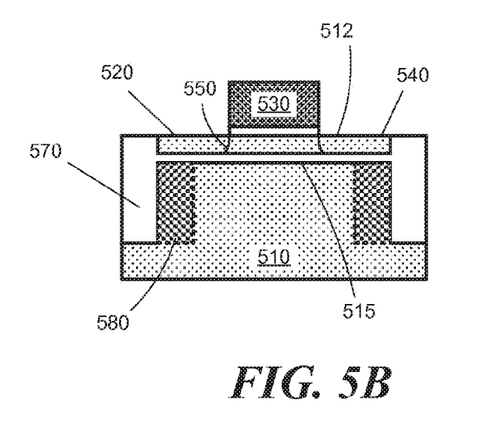

Some embodiments may include inducing strain in FD-SOI FETs, as depicted in FIGS. 5A-5B. FIG. 5A depicts a plan view of a FD-SOI FET having a gate electrode 530 formed on a thin gate insulator, as shown in FIG. 5B, a source region 520, and a drain region 540. The source region, channel region 550, and drain region may be formed in a thin semiconductor layer 512 that is separated from a substrate 510 by a thin insulating layer 515. The FD-SOI FET may include trench isolation structures 570 formed along edges of the source and drain regions.

As part of the process of forming the trench isolation structures 570, the strain-inducing regions 580 may be formed, e.g., as done in FIGS. 3I-3J. An upper portion of the substrate 512 may be covered, so that a conversion material (340 in FIG. 3I) forms in contact with only the substrate 510. A subsequent heating step may condense a chemical component into converted regions 380 of the substrate below the source and drain regions while forming isolating oxide in the trenches at the same time. The converted regions may form under stress and relax during the heating, which imparts strain (e.g., tensile strain as depicted by the bold arrows in FIG. 5A) to the upper semiconductor layer 512. The imparted strain may extend to the channel region 550 of the device.

The described methods of forming strained channel devices may be employed for CMOS circuits. In a CMOS circuit, there will be transistors of two types: n-channel type and p-channel type. Since a conversion material 340 may induce only one type of strain in a transistor's channel region for a given substrate type, transistors of a first type, e.g., n-channel MOS, may benefit from increased electron mobility in the channel due to the strain, whereas transistors of a second type, e.g., p-channel MOS, may incur decreased mobility and degraded transistor performance because the channel strain is of the wrong type. For example, a conversion material 340, e.g., SiGe, that generates tensile strain in Si channel regions may benefit n-channel FETs, because the electron mobility increases under tensile strain. However, hole mobility decreases under tensile strain, so p-channel FETs formed in the same region would incur reduced performance, which may be undesirable. The described methods of forming strained channel devices can accommodate both types of FETs formed on a same substrate, such that performance of one type of FET may be improved while the performance of the other type of FET may not be degraded substantially or may also be improved.

In some embodiments, regions of the substrate in which strain is desired for channel regions of FETs of a first channel type may be processed according to the steps illustrated in FIGS. 3A-3O. In some embodiments, other regions of the same substrate may be processed similarly, except that additional steps may be taken to prevent the formation of conversion material 340 adjacent active regions of devices. For example, after forming filling material 320 in FIG. 3C, portions of the substrate for which no strain is desired may be masked with a resist or hard mask to prevent the etch of the filling material depicted in FIG. 3D. The resist or hard mask may be formed and patterned on the filling material 320. Alternatively, a resist or hard mask may be formed over regions of the substrate shown in FIG. 3G, for which no strain is desired. The resist or hard mask may be patterned to block the formation of conversion material 340 in certain regions of the substrate, and thereby prevent straining of FET channels formed in those regions, for example. Therefore, FETs having no strain in their channel regions may be formed on the same substrate as strained-channel FETs.

Having strained and unstrained regions of semiconductor material on a same substrate can be advantageous for CMOS FET circuitry. For example, a first type of FET, e.g., an n-channel, Si FET, that benefits from increased carrier mobility according to a particular strain (tensile) may be located in a region where the semiconductor is strained due to nearby strain-inducing regions 350. A second type of FET, e.g., p-channel, may be located at a different region of the substrate where the semiconductor is not strained, so that the second type of FET does not incur reduced performance due to the wrong type of strain. Such localized strain control can enhance mobility of carriers in a first type of FET without degrading mobility of carriers in a second, opposite type of FET formed on the same substrate.

In some embodiments, channel regions may be formed under tensile strain in a first region of the substrate, e.g., using the steps described for FIGS. 3A-3K with a Si/SiGe combination of materials. In a second region of the substrate, channel regions may be formed under compressive strain, e.g., using the steps described for FIGS. 3A-3K with a Si/SiC combination of materials. At least a portion of the processes may be executed concurrently, e.g., up to the steps associated with FIG. 3G. Subsequently, a second portion of the substrate may be masked to prevent formation of strain-inducing material 340 of a first type (e.g., SiGe) so that the first type of strain-inducing material may be formed at the first portion of the substrate. Then, the first portion of the substrate may be masked to prevent formation of 340 of a second type of strain-inducing material (e.g., SiC), so that the second type of strain-inducing material may be formed at the second portion of the substrate.

According to some embodiments, the orientation of trenches, strain-inducing regions 350, and channel regions may be selected with respect to a semiconductor's crystallographic orientation at the channel region, so as to improve carrier mobility. For a given semiconductor, carrier mobility may be increased to higher values when strain is directed along one crystallographic orientation as compared to another crystallographic orientation. Accordingly, a semiconductor may have a preferred strain direction (for uniaxial strain) or orientation (for multi-axial strain) that provides a higher mobility enhancement than other strain directions or orientations. According to some embodiments, a semiconductor may have a preferred axial strain type (e.g., uniaxial, biaxial, radial, etc.) that provides a higher mobility enhancement than other strain types. A device may be fabricated such that it takes advantage of a preferred strain direction or orientation and/or a preferred strain type. For example, trenches, strain-inducing regions 350, and channel regions may be oriented so as to induce strain in a channel region of a transistor in a preferred strain direction or orientation and/or of a preferred strain type.

As may be appreciated from the foregoing description, strained-channel regions of FETs may be formed without a need for epitaxially growing a strained layer of semiconductor material of a first type (e.g., Si for the channel region) on a layer of semiconductor of a second type, e.g., SiGe. Accordingly, problems associated with defects in the semiconductor of the second type, which itself may have been epitaxially grown, may be avoided. For example, for epitaxial growth of a channel region, the underlying semiconductor should have a low defect density at the growth surface. Alternatively, the processes described above avoid a need for high-quality epitaxial growth of the channel region. Additionally, the epitaxial growth of the converting material 340 need not be of high quality and may not require high concentrations of a straining dopant, since the straining dopant (e.g., Ge) may be driven into and concentrated into the strain-inducing region and the converting material transformed and/or removed.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Although some of the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:
1. A device, comprising:
a substrate having a first surface, a second surface, a first inner sidewall that extends between the first and the second surfaces of the substrate, and a second inner sidewall that extends between the first and the second surfaces of the substrate;
a plurality of fins formed in the substrate and positioned between the first inner sidewall and the second inner sidewall, the fins extend between the first surface and the second surface of the substrate, each of the fins including a first semiconductor material portion on a second semiconductor material portion, the first semiconductor material being different from the second semiconductor material;
an insulator on the second surface of the substrate, the insulator positioned between adjacent ones of the plurality of fins, the insulator being positioned adjacent to the second semiconductor material portion of each fin; and
a gate structure on the insulator and on the plurality of fins.

2. The device of claim 1 wherein the gate structure is positioned adjacent to the first semiconductor material portion of each fin.

3. The device of claim 1 wherein the second semiconductor material portions of the fins impart strain to the first semiconductor material portions of the fins.

4. The device of claim 3 wherein the first semiconductor material includes silicon and the second semiconductor material includes silicon germanium.

5. The device of claim 1 wherein the substrate includes the first semiconductor material.

6. The device of claim 1 wherein the gate structure includes:
a gate dielectric layer formed on the insulator and adjacent to the first semiconductor material portions of the plurality of fins; and
a gate conductor on the gate dielectric layer.

7. The device of claim 6 wherein the gate conductor is in direct contact with the insulator between the adjacent ones of the plurality of fins.

8. The device of claim 6 wherein the gate conductor is positioned between, and spaced apart from, the first and the second inner sidewalls of the substrate.

9. The device of claim 1 wherein the substrate includes portions of the second semiconductor material along the first and the second inner sidewalls.

10. A device, comprising:
a substrate of a first semiconductor material, the substrate having a first surface;
a plurality of recesses in the substrate, the recesses extending into the substrate from the first surface;

a plurality of fins formed by the plurality of recesses, each fin including a first portion of the first semiconductor material and a second portion including germanium, the first portion overlying the second portion;

an insulating layer on the substrate, the insulating layer being positioned in the recesses and in abutting contact with the second portions of the fins; and a gate structure on three sides of the first portions of the plurality of fins.

11. The device of claim 10 wherein the first portion of each of the plurality of fins includes a source region, a drain region and a channel region between the source and the drain regions, and the gate structure abuts three sides of the channel region of each of the first portions of the plurality of fins.

12. The device of claim 10 wherein the gate structure abuts the insulating layer in the recesses.

13. The device of claim 10 wherein the second portions of the fins impart strain to the first portions of the fins.

14. The device of claim 10 wherein the gate structure includes:

a gate dielectric layer on the first portions of the plurality of fins; and a gate conductor on the gate dielectric layer.

15. The device of claim 14 wherein the gate dielectric layer and the gate conductor are in abutting contact with the insulating layer in the recesses.

16. A device, comprising:

a substrate;

a plurality of trenches formed in the substrate;

a plurality of fins formed in the substrate, each of the fins being spaced apart from at least one other fin by at least one of the trenches, each of the fins including:

a first portion including a strain-inducing material, and a second portion on the first portion, the first portion imparts strain to the second portion, the second portion including a source region, a drain region and a channel region between the source and the drain regions; and a gate structure that extends over the channel regions of each of the plurality of fins.

17. The device of claim 16, further comprising:

an insulating material in the trenches, the insulating material having an upper surface that is substantially coplanar with an upper surface of the first portions of the fins.

18. The device of claim 17 wherein the gate structure abuts the upper surface of the insulating material in the trenches.

19. The device of claim 16 wherein the substrate includes a first inner sidewall and a second inner sidewall, the plurality of fins disposed between the first and the second inner sidewalls, and the gate structure is spaced apart from the first and the second inner sidewalls.

20. The device of claim 19 wherein the substrate includes portions of the strain-inducing material along the first and the second inner sidewalls.

21. The device of claim 16 wherein the substrate includes a first inner sidewall and a second inner sidewall, the plurality of fins disposed between the first and the second inner sidewalls, the first and the second inner sidewalls including respective regions of the strain-inducing material.

\* \* \* \* \*